(12) United States Patent
Young et al.

(10) Patent No.: US 7,573,925 B1
(45) Date of Patent: Aug. 11, 2009

(54) SEMICONDUCTOR LASER HAVING A DOPED ACTIVE LAYER

(75) Inventors: David Bruce Young, Oakland, CA (US); Yuk Lung Ha, San Jose, CA (US); Ashish Verma, San Jose, CA (US); Lars Eng, Los Altos, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/749,013

(22) Filed: May 15, 2007

Related U.S. Application Data

(60) Provisional application No. 60/747,294, filed on May 15, 2006.

(51) Int. Cl.
*H01S 5/00* (2006.01)

(52) U.S. Cl. ............... 372/43.01; 372/45.01; 372/46.01

(58) Field of Classification Search .............. 372/43.01, 372/45.01
See application file for complete search history.

(56) References Cited

U.S. PATENT DOCUMENTS

| | | | |
|---|---|---|---|
| 4,092,659 A | 5/1978 | Ettenberg | |
| 4,740,987 A | 4/1988 | McCall et al. | |
| 4,859,628 A | 8/1989 | Knight et al. | |
| 4,951,292 A | 8/1990 | Kuindersma et al. | |
| 5,208,821 A | 5/1993 | Berger et al. | |
| 5,450,432 A | 9/1995 | Okuda | |
| 5,675,601 A | 10/1997 | Karakida et al. | |
| 5,793,787 A | 8/1998 | Meyer et al. | |
| 6,219,366 B1 | 4/2001 | Furushima | |
| 6,618,410 B1 * | 9/2003 | Fischer et al. | 372/45.01 |
| 2002/0037024 A1 | 3/2002 | Huang | |
| 2002/0114367 A1 | 8/2002 | Stintz et al. | |
| 2002/0117675 A1 | 8/2002 | Mascarenhas | |
| 2003/0002557 A1 | 1/2003 | Eng et al. | |
| 2003/0179795 A1 | 9/2003 | Moriya et al. | |
| 2004/0079967 A1 | 4/2004 | Shakuda et al. | |
| 2004/0086017 A1 * | 5/2004 | Yoshida et al. | 372/46 |
| 2004/0190835 A1 | 9/2004 | Burdick et al. | |
| 2005/0031000 A1 | 2/2005 | Botez | |

FOREIGN PATENT DOCUMENTS

JP 2000-340894 * 12/2000

OTHER PUBLICATIONS

Sudo, Tsurugi, et al., Semiconductor Laser Having Low Stress Passivation Layer, U.S. Appl. No. 11/749,047, filed May 15, 2007.
Ha, Yuk Lung, et al., Epitaxial Regrowth in a Distributed Feedback Laser, U.S. Appl. No. 11/749,007, filed May 15, 2007.

(Continued)

*Primary Examiner*—Dung T Nguyen
(74) *Attorney, Agent, or Firm*—Workman Nydegger

(57) ABSTRACT

Semiconductor lasers having a doped active region. In one example embodiment, a laser includes a substrate and a doped active region positioned above the substrate. The doped active region includes a plurality of quantum wells separated by a plurality of barrier layers. The quantum wells and the barrier layers are doped with a doping material with a concentration between about $1*10^{16}/cm^3$ to about $1*10^{17}/cm^3$.

20 Claims, 4 Drawing Sheets

OTHER PUBLICATIONS

Verma, Ashish K., et al., Thin INP Spacer Layer in High Speed Laser for Reduced Lateral Current Spreading, U.S. Appl. No. 11/749,003, filed May 15, 2007.

Dimitrov, Roman, et al., Method for Applying Protective Laser Facet Coatings, U.S. Appl. No. 11/749,052, filed May 15, 2007.

Dimitrov, Roman, et al., High Resistivity Engineered Laser Facet Coatings, U.S. Appl. No. 11/749,057, filed May 15, 2007.

Dimitrov, Roman et al., Laser Facet Pre-Coating Etch for Controlling Leakage Current, U.S. Appl. No. 11/749,061, filed May 15, 2007.

Sexl, M., Bohm G., Maier, M., Tranke, G., Weimann, G., & Abstreiter, G. (1997), MBE Growth of Metamorphic In(Ga)A/As Buffers. 1997 IEEE International Symposium on Compound Semiconductors, IEEE, 49-52.

U.S. Appl. No. 11/749,007, mailed Dec. 9, 2008, Office Action.

U.S. Appl. No. 11/749,047, mailed Aug. 12, 2008, Office Action.

U.S. Appl. No. 11/749,047, mailed Feb. 6, 2009, Notice of Allowance.

U.S. Appl. No. 11/749,033, mailed Jun. 2, 2008, Office Action.

U.S. Appl. No. 11/749,033, mailed Jan. 13, 2009, Notice of Allowance.

U.S. Appl. No. 11/749,057, mailed Dec. 11, 2008, Office Action.

* cited by examiner

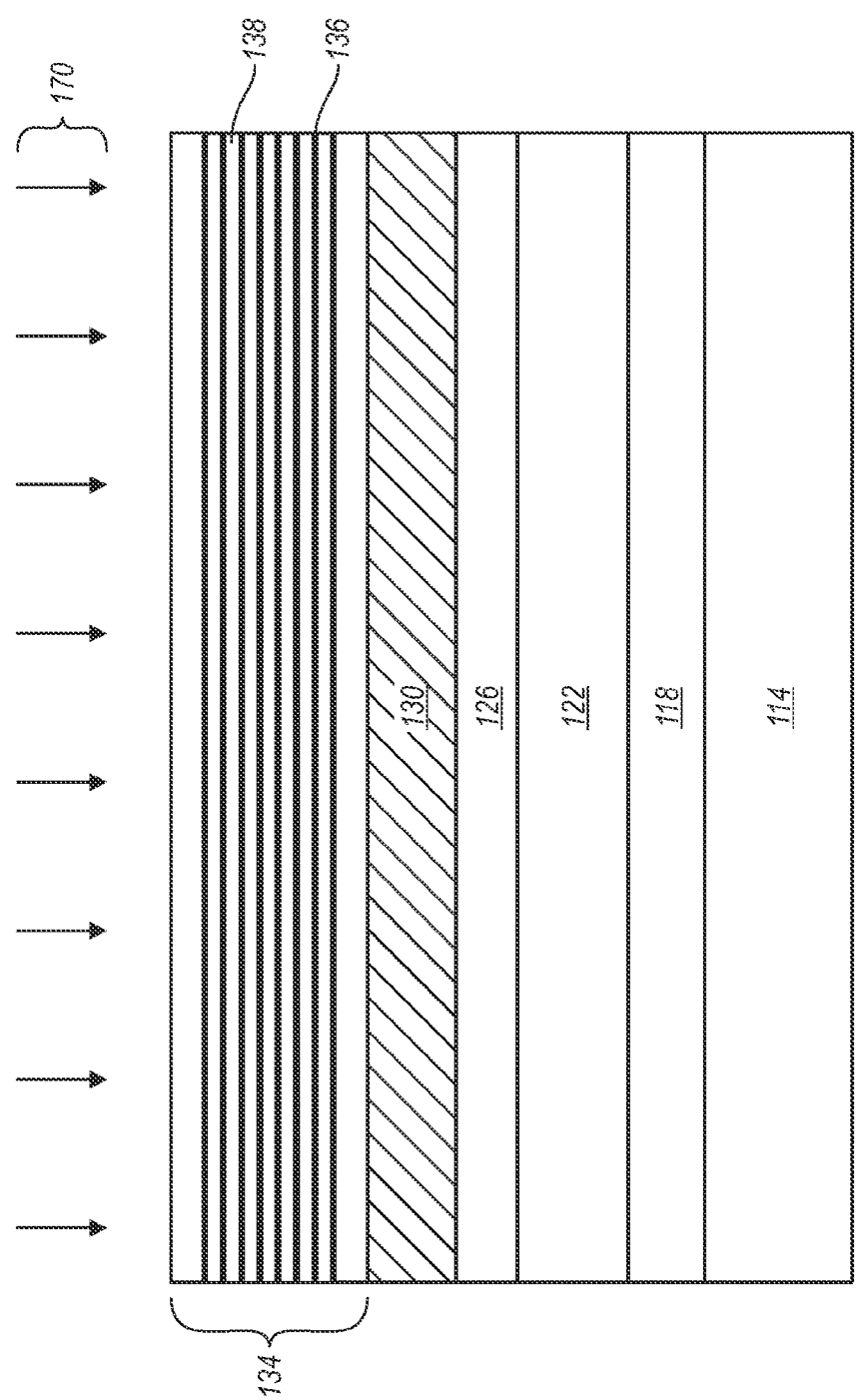

SEMICONDUCTOR LASER HAVING A DOPED ACTIVE LAYER

CROSS-REFERENCE TO RELATED APPLICATION

This application claims priority to U.S. Provisional Patent Application Ser. No. 60/747,294, filed on May 15, 2006, which is incorporated herein by reference in its entirety.

BACKGROUND

1. The Field of the Invention

The present invention generally relates to semiconductor optical devices. In particular, the present invention relates to a semiconductor lasers having a doped active region for control of the position of the p-n junction located therein.

2. The Related Technology

Semiconductor lasers are currently used in a variety of technologies and applications, including communications networks. Examples of semiconductor lasers include Fabry-Perot ("FP") lasers and distributed feedback ("DFB") lasers. A DFB laser produces a stream of coherent, monochromatic light by stimulating photon emission from a solid state material. DFB lasers are commonly used in optical transmitters, which are responsible for modulating electrical signals into optical signals for transmission via an optical communication network.

Generally, a DFB laser includes a positively or negatively doped bottom layer or substrate, and a top layer that is oppositely doped with respect to the bottom layer. An active region, bounded by confinement regions, is included at the junction of the two layers. These structures together form the laser body. A coherent stream of light that is produced in the active region of the DFB laser can be emitted through either longitudinal end, or facet, of the laser body. One facet is typically coated with a high reflective material that redirects photons produced in the active region toward the other facet in order to maximize the emission of coherent light from that facet end. A grating is included in either the top or bottom layer to assist in producing a coherent photon beam. DFB lasers are typically known as single mode devices as they produce light signals at one of several distinct wavelengths, such as 1,310 nm or 1,550 nm. Such light signals are appropriate for use in transmitting information over great distances via an optical communications network.

One challenge relating to DFB and other directly modulated lasers involves accurate positioning of the p-n junction in the active layer of the device structure. Specifically, the p-n junction may not be accurately defined with respect to one or more quantum wells disposed within the active layer, which can undesirably result in a reduction in laser speed and variability in overall laser performance.

Therefore, a need exists in the art for a semiconductor optical device, such as a directly modulated DFB laser, having a well-defined p-n junction in its active layer such that it does not suffer from the above-described challenges.

BRIEF SUMMARY OF SOME EXAMPLE EMBODIMENTS

In general, example embodiments of the invention relate to a semiconductor lasers having a doped active region. In some example embodiment, the doped active region can help control of the position of the p-n junction located therein.

In one example embodiment, a laser includes a substrate and a doped active region positioned above the substrate. The doped active region includes a plurality of quantum wells separated by a plurality of barrier layers. The quantum wells and the barrier layers are doped with a doping material with a concentration between about $1*10^{16}/cm3$ to about $1*10^{17}/cm3$.

In another example embodiment, a distributed feedback ("DFB") laser includes an n-type substrate, a p-type grating layer, and a doped active region interposed between the n-type substrate and the p-type grating layer. The doped active region includes a plurality of quantum wells separated by a plurality of barrier layers. The quantum wells and the barrier layers are doped with a p-type zinc material with a concentration between about $1*10^{16}/cm3$ to about $5*10^{16}/cm3$.

These and other aspects of example embodiments of the present invention will become more fully apparent from the following description and appended claims.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 4 is a cross sectional side view of a portion of the epitaxial base portion shown in FIG. 2 during one processing stage, wherein a dopant is applied to a portion of the laser in accordance with one embodiment.

DETAILED DESCRIPTION OF SOME EXAMPLE EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-4 depict various features of embodiments of the present invention, which are generally directed to a semiconductor laser device, such as a distributed feedback laser or a Fabry-Perot laser, having a doped active layer, and a method for producing such a laser device. Doping of the active layer in the manner described herein enables high speed, reliable optical signal production from the laser device to occur without a correspondent substantial reduction in optical output.

Note at the outset that the discussion to follow regarding embodiments of the present invention should not be construed as limiting the application to such embodiments. Indeed, devices and components apart from optical transmitters and transceiver modules that employ laser devices and other suitable light sources can also benefit from the teachings to be discussed herein.

1. Exemplary Operating Environment

Figure 1:
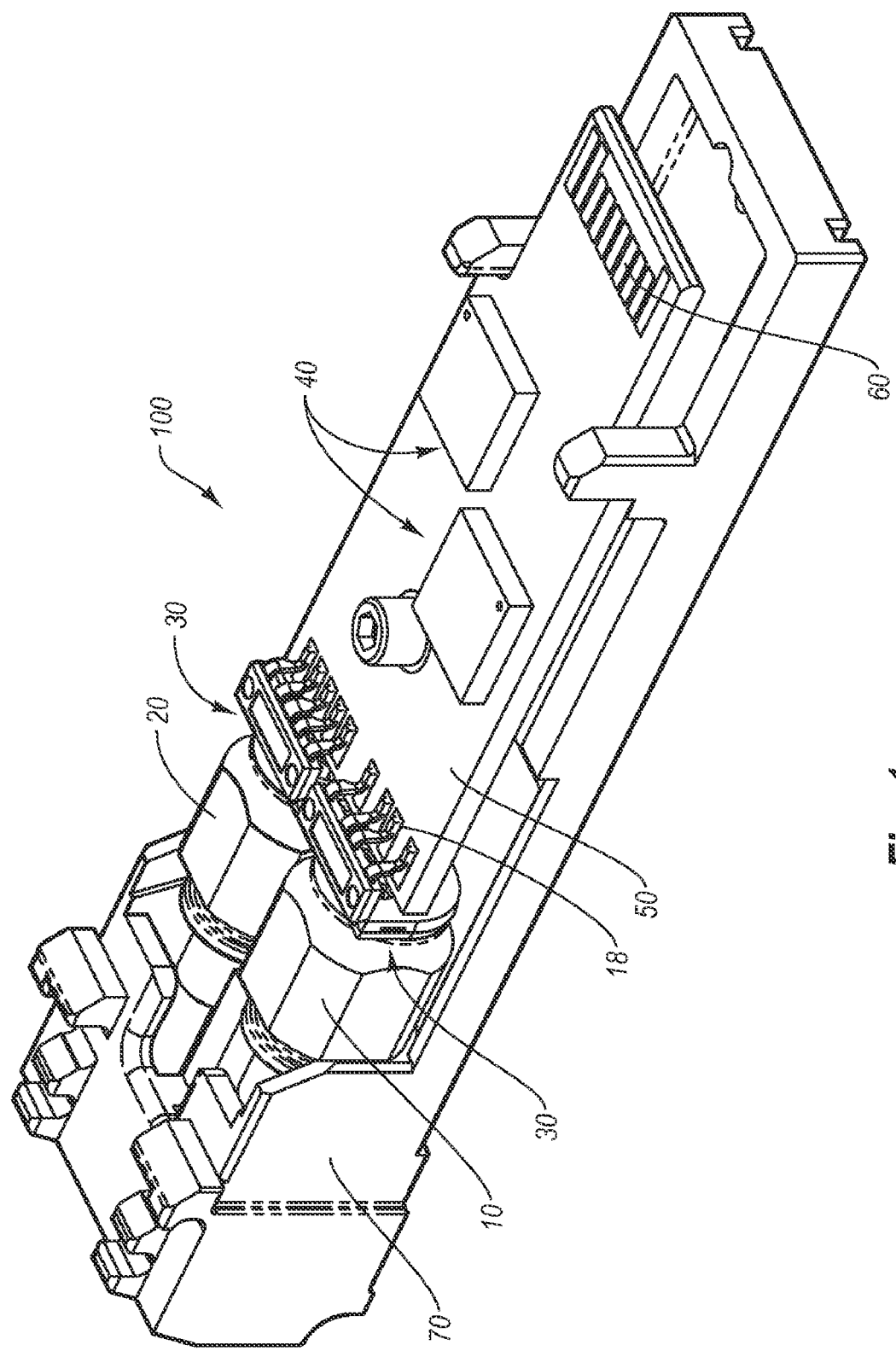
FIG. 1 is a perspective view of an optical transceiver module that serves as one exemplary environment in which embodiments of the present invention can be practiced.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 10, a transmitter optical subassembly ("TOSA") 20, electrical interfaces 30, various electronic components 40, and a printed circuit board ("PCB") 50. In detail, two electrical interfaces 30 are included in the transceiver 100, one each used to electrically connect the ROSA 10 and the TOSA 20 to a plurality of conductive pads located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a shell 70. Though not shown, the shell 70 can cooperate with a housing portion to define a covering for the components of the transceiver 100.

While discussed in some detail here, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 2.5 Gbit, 4 Gbit, 8 Gbit, 10 Gbit, or higher rates. Furthermore, the principles of the present invention can be implemented in optical transmitters and transceivers of shortwave and long wave optical transmission and any form factor such as XFP, SFP and SFF, without restriction.

The TOSA 20 of the transceiver 100 is one example of an optical transmitter that can employ an optical source, such as a semiconductor laser, that is configured according to embodiments of the present invention. The TOSA 20 generally includes a housing within which the optical source is positioned. Briefly, in operation the transceiver 100 receives electrical signals from a host (not shown) or other data signal-producing device to which the transceiver is operably connected for transmission onto an optical fiber operably connected to the TOSA 20. Circuitry of the transceiver 100 drives a laser (described below) within the TOSA 20 with signals that cause the TOSA to emit onto the optical fiber optical signals representative of the information in the electrical signal provided by the host. Accordingly, the TOSA 20 serves as an electro-optic transducer.

Having described a specific environment with respect to FIG. 1, it will be understood that this specific environment is only one of countless architectures in which the principles of the present invention may be employed. As previously stated, the principles of the present invention are not intended to be limited to any particular environment.

2. Structural and Operational Aspects of Laser Having Doped Active Layer

Figure 2:
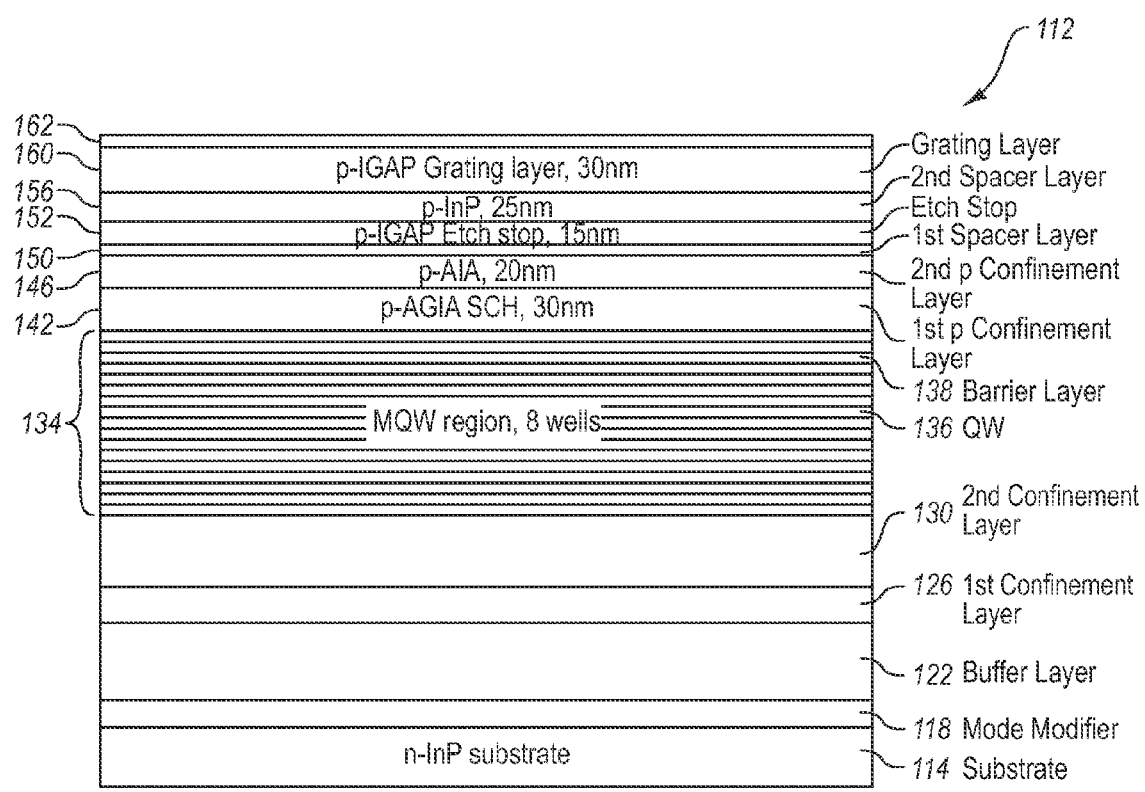
FIG. 2 is a cross sectional side view of an epitaxial base portion of a distributed feedback ("DFB") laser, according to one embodiment of the present invention.
Figure 3:
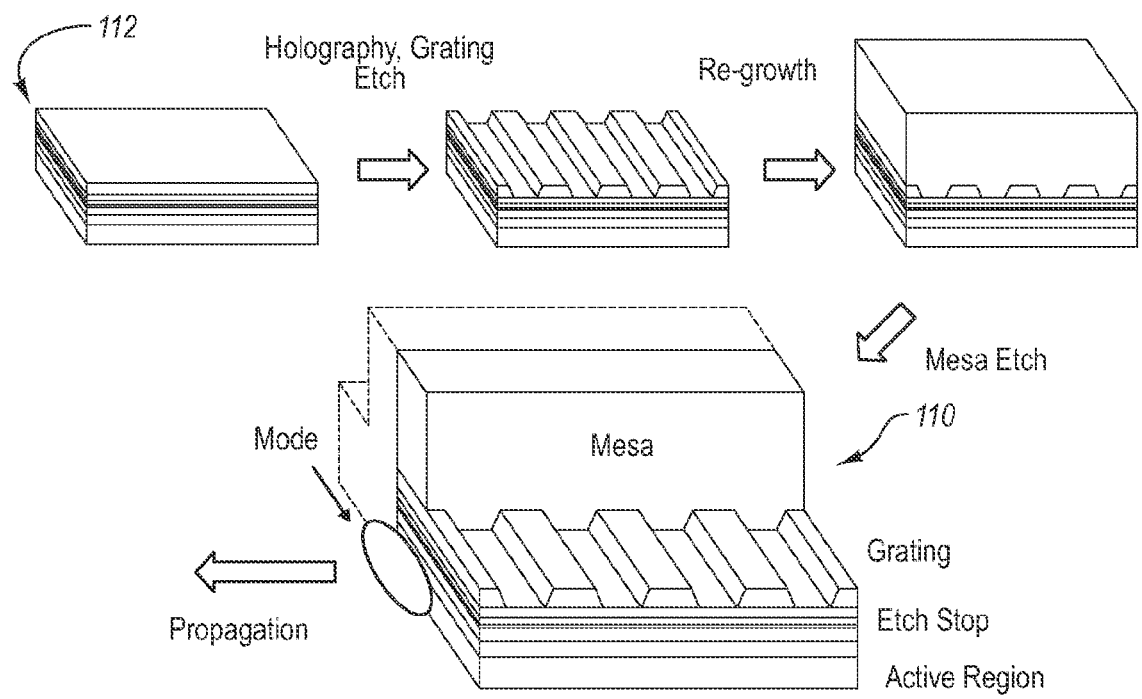
FIG. 3 is a progressive view of various processing and manufacture stages performed on the epitaxial base portion shown in FIG. 2.

Together with FIG. 1, reference is now made to FIGS. 2 and 3. In general, the operating environment described above, including the transceiver 100 and TOSA 20, is exemplary of one environment in which principles of the present invention can be practiced. In particular, embodiments of the present invention disclose a laser device having an active layer that is doped in such a way as to provide enhanced carrier transport and modulation efficiency while also minimizing power loss during laser operation.

A distributed feedback ("DFB") laser is one example of a semiconductor optical device employed according to embodiments of the present invention. By way of general overview, a DFB laser contains a cavity having an active medium and a distributed reflector that operates in a wavelength range of the laser action. The DFB laser has multiple modes, including both longitudinal and transversal modes, but one of these modes will typically offer better loss characteristics relative to the other modes. This single mode typically defines a single-frequency operation of the DFB laser.

The following description provides various details regarding a ten gigabit/second ("10 G") DFB laser configured for light emission at a wavelength of approximately 1310 nm. The following description includes both structural and functional characteristics of the 10 G DFB laser, together with certain details regarding the manufacturing processes used to build the laser. Note, however, that this description is meant to be exemplary only; indeed, lasers (such as Fabry-Perot lasers) and other semiconductor optical devices having structural and/or functional aspects that differ from the present description can also benefit from the principles of embodiments of the present invention as disclosed herein. It is also appreciated that additional or alternative layers, layer thicknesses, or structures can be incorporated into the present laser device as will be understood by those of skill in the art. The following discussion is therefore not intended to limit the present invention in any way.

a. Base Epitaxial Layers

FIG. 2 illustrates layers of a base epitaxial portion 112 of a 10 G DFB laser, generally designated at 110, at a stage prior to etching of the grating layers. The DFB laser 110 is grown on an Indium Phosphide substrate (n-InP substrate) 114.

A "mode modifier" layer (n-IGAP Mode Modifier) 118 is grown on top of the substrate 114 using Indium Gallium Arsenide Phosphide at an approximate thickness of 120 nm. This layer functions to reduce the power of second-order transversal modes that propagate within the laser structure. In particular, the mode modifier layer 118 effectively increases the loss associated with these second-order transverse modes and couples the modes away from the gain medium of the laser. This suppression of second-order transverse modes allows for wider mesa widths on the laser because the laser is less sensitive to these modes.

A buffer layer (n-InP) 122 is made of Indium Phosphide and grown on top of the "mode modifier" layer 118. This buffer layer is approximately 1.4 μm thick and provides a surface on which the n-layers of the laser are grown.

A first n-confinement layer 126 of Aluminum Indium Arsenide (n-AIA) is grown at a thickness of approximately 20 nm on the buffer layer and is doped with silicon. A second n-confinement layer 130 of Aluminum Gallium Indium Arsenide (n-AGIA SCH) is grown at a thickness of 30 nm on the n-AIA layer and is also doped with silicon. Both of these layers are current confinement layers and effectively maintain electrons within the laser active region so that photons are produced. The n-AGIA SCH second n-confinement layer 130 is graded to improve the confinement characteristics of the layer. The thicknesses of these n-layers were designed to be thin in order to optimize the thermal performance of the laser.

A multi-quantum well active region (MQW region) 134 is grown on the n-type confinement layers. The active region 134 is designed to have eight wells 136 with corresponding wavelengths of 1295 nm. Quantum barriers 138 between the wells have corresponding wavelengths of approximately 980 nm. Standard barrier wavelengths are in the range of 1060-1090 nm and thus have smaller barrier heights than the present multi-quantum-well design. The depth and width of the wells are designed to produce a 1310 nm photon. The active region is designed to be "strain compensated" which means that the barriers are designed to have opposing strain characteristics relative to the well strain characteristics. As a result, the strain generated from the barriers at least partially cancels the strain generated by the wells and reduces the overall strain on the layer. The present well design is intentionally manufactured so that a complete cancellation of strain does not occur, but a small amount of strain remains for performance reasons.

In addition, the layers of the MQW region 134 are intentionally doped with Zn, to maintain a low-level p-type doping. This is done to assure that the p-n junction of the laser diode always occurs in the same place, and is not made variable by unpredictable dopant diffusion processes. Further details regarding the doping of the MQW region 134 will be given further below.

A first p-confinement layer 142 of Aluminum Gallium Indium Arsenide (p-AGIA SCH) is grown on the active region at a thickness of 30 nm and is doped with zinc. A second p-confinement layer 146 of Aluminum Indium Arsenide (p-AIA) is grown at a thickness of 20 nm on the p-AGIA SCH layer and is also doped with zinc. Both of the p-layers are confinement layers and effectively maintain holes within the active region so that photons are produced. The p-AGIA SCH layer 142 is graded to improve the confinement characteristics of the layer. The thicknesses of these p-layers were designed to be thin in order to optimize the speed and thermal performance of the laser.

A spacer layer 150 is located above the p-confinement layers. This spacer layer is made of Indium Phosphide and is approximately 5 nm in thickness. The thinness of the spacer layer improves the coupling efficiency of the grating and improves the speed of the laser. In particular, the spacer layer effectively controls the degree to which lateral current spreading occurs between the bottom of the ridge mesa and the active region.

Various "above-active" grating layers are located above the spacer layer. An etch stop layer (p-IGAP etch stop) 152 made of Indium Gallium Arsenide Phosphide and having a thickness of 15 nm is grown on the spacer layer 150. This etch stop layer is provided for stopping the mesa etch.

A second spacer layer 156 is provided to separate the etch stop layer 152 and the grating layer. In the illustrated design, the grating etch step is timed to stop within this spacer layer. The layer is made of Indium Phosphide (p-InP) at a thickness of 25 nm.

A grating layer (p-IGAP) 160 is grown on the second spacer layer 156 and is made of Indium Gallium Arsenide Phosphide at a thickness of 30 nm. The grating layer is "above active" (as compared to other possible designs in which the grating is below the active region). Laser holography, wet etching, and subsequent InP regrowth, as explained further below, are used to create a uniform grating, consisting of alternating layers of high index IGAP and low index InP down the length of the laser cavity.

The laser cavity of the DFB laser 110 can support two degenerate longitudinal grating modes because the grating formed in the grating layer 160 is uniform (as opposed to, e.g., a quarter-wave shifted design). Selection of one or the other of these two modes is dependent upon the phase associated with the facet cleave, which is dependent upon the location of the cleave with respect to the grating period. Because the location of the cleave cannot be controlled with sufficient precision, all phase possibilities will be represented by any ensemble of devices of this design. As a result, there will always be a finite percentage of laser parts for which both grating modes are equally supported, resulting in inadequate single-mode behavior. These lasers are discarded and not sold.

A top layer 162 is provided above the grating layer on which regrowth of other layers is performed. This top layer is a thin layer of Indium Phosphide.

b. Grating Fabrication and Regrowth

FIG. 3 illustrates various grating fabrication and subsequent regrowth stages employed in forming portions of the structure of the DFB laser 110. In particular, FIG. 3 shows a side view of the base epitaxial structure 112 of FIG. 2, together with subsequent grating fabrication and regrowth of the DFB laser 110. As described above and by way of brief overview, a wet etch is performed to etch periodic gaps within the grating layer. After the etch is completed and the grating teeth are created, thick Indium Phosphide is grown on the etched, base epitaxial structure, in order to fill the gaps with low-index InP and also to form the mesa layer. The regrowth is completed with an Indium Gallium Arsenide layer for electrical contact.

This regrowth Indium Phosphide is used to create a mesa on the epitaxial base that provides current confinement and also functions as a waveguide, by virtue of lateral optical confinement. This structure is also referred to herein as a "ridge waveguide" structure. Photoresist is used to etch ridges on the regrowth that creates ridges to define the mesa of the DFB laser. Both dry and wet etching is used in creating the mesa ridges.

After the etching process, a dielectric layer is placed on the structure. In the present design, a "triple stack" of Silicon Nitride, Silicon Dioxide, and Silicon Nitride is used as the dielectric. This layer is typically thick in order to reduce parasitic capacitance (and improve speed) and is used to confine the current within the mesa.

The dielectric layer is removed from the top of the mesa to allow an electrical contact and metallic layer to be placed on the mesa. Electrical contact is made by depositing metal onto the Indium Gallium Arsenide layer at the top of the mesa. This contact is both a non-alloy contact and a low penetration contact.

A metallic layer is placed on the electrical contact to which electrical current may be provided to the laser structure. In the present embodiment, the metallic layer is made of three sub-layers of titanium, platinum and gold. A titanium layer is placed directly on the electrical contact layer, then a platinum layer and a gold layer is applied. This metallic layer provides sufficient conductivity to the Indium Gallium Arsenide layer so that current can be properly provided to the laser structure.

Bottom electrical contacts are generated by thinning the InP substrate and placing an n-type metallic layer on the bottom.

A DFB laser is removed from a wafer using common techniques by cleaving and breaking the wafer both horizontally and laterally to separate each laser. After this process, AR and HR coating is performed to encapsulate the active region of the laser and provide the requisite reflectivity characteristics of the laser cavity. The reflectivity characteristics define the optical power emitted from the back of the laser and the front of the laser. In uniform grating designs, a majority of the optical power is emitted from the front of the laser which couples into optical fiber. A minority of the optical power is emitted from the back of the laser which may couple with a photodetector (not shown) that is used to monitor the laser performance.

In one embodiment, the coating is made of layers of Silicon Oxide and Silicon. The reflectivity of the AR coating is designed to be less that 0.5% and the HR coating is designed to be approximately 96%. Once the coating process is complete, a testing process is performed in which the power characteristics and optical spectrum are tested.

The DFB laser 110 and photodetector are packaged into an optical sub-assembly, which is subsequently packaged into an optical module along with driver and control integrated circuits.

Reference is now made to FIG. 4, in which various layers of the base epitaxial structure of the DFB laser 110 shown in FIG. 2 are depicted. As mentioned, and according to one embodiment, the quantum well layers 136 of the multiple quantum well active region 134 can be doped so as to accurately define the p-n junction residing within the region. Accurate definition of this junction can result in improved carrier transport, resulting in enhanced modulation efficiency during laser operation.

In one embodiment, the laser 110 is formed to the point shown in FIG. 4, wherein the active region 134, including the quantum well layers 136 and barrier layers 138 are deposited atop the $2^{nd}$ n-confinement layer 130. At this point, a p-type dopant, indicated at 170 in FIG. 4, is incorporated into the active region 134. In the present embodiment, the p-type dopant is a zinc dopant, but other suitable p-type dopants, including beryllium and carbon, can alternatively be employed.

Incorporation of the dopant 170 into the active region 134 can be accomplished by any suitable method, including diffusion, chemical vapor deposition, etc. The doping concentration can be controlled in order to enable the p-n junction within the active region 134 to be precisely positioned. In one embodiment, the active region 134 is doped by a zinc dopant to a concentration of between $1*10^{\wedge}16/cm^3$ to $1*10^{\wedge}17/cm^3$. Doping at this concentration is sufficient to enable definition of the p-n junction location within the active region 134 while remaining as a relatively light doping such that significant output loss does not occur with the laser during operation, as may be the case with heavier doping.

In other embodiments, the doping concentration can be varied according to the needs of the particular laser configuration. Generally, however, zinc doping concentration within a range between approximately $1*10^{\wedge}16/cm^3$ and $5*10^{\wedge}16/cm^3$ is preferred in one embodiment in order to enable the laser to exhibit the desirable qualities discussed above. The doping concentration and doping time can, of course, vary according to particular lasing characteristics sought, the type of dopant used, the desired p-n junction location, etc. Note also that, in one embodiment, an n-type dopant can be employed, assuming the respective n-type and p-type regions of the laser are inverted.

In one alternative embodiment, doping of the active region 134 can occur after deposition of both the first and second p-confinement layers 142 and 146, if desired. In yet other embodiments, the doping can occur after additional layer(s) atop the confinement layers are deposited.

In another alternative embodiment, a Fabry-Perot ("FP") laser can include a doped active region similar to the active region 134 disclosed herein in connection with the DFB laser 110. The alternative FP laser would also minimally include at least a substrate similar to the substrate 114 disclosed herein.

A laser, such as the DFB laser 110 described herein, having a doped active region as discussed above exhibits improved speed performance and modulation efficiency by virtue of the fact that the p-n junction is uniformly defined laterally within the active region as a result of the p-type doping. Moreover, output loss is minimized because of the relatively light doping concentration used.

Note that, though it includes eight (8) quantum wells in FIG. 4, the active region in other embodiments can include more or fewer quantum wells while still benefiting from the principles of the present invention. Indeed, an active region having a single quantum well can be employed in one embodiment. Also, the p-type and n-type layers and materials disclosed herein can be replaced with n-type and p-type layers and materials, respectively, in one embodiment.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A DFB laser, comprising:
   a substrate;
   a mode modifier layer positioned above the substrate;
   a buffer layer positioned above the mode modifier layer;
   a first confinement layer positioned above the buffer layer;
   a second confinement layer positioned above the first confinement layer;
   a doped active region positioned above the second confinement layer, the doped active region comprising:
      a plurality of quantum wells separated by a plurality of barrier layers, wherein the quantum wells and the barrier layers are doped with a doping material with a concentration between about $1*10^{\wedge}16/cm^3$ to about $1*10^{\wedge}17/cm^3$;
   a third confinement layer positioned above the doped active region;
   a fourth confinement layer positioned above the third confinement layer;
   a first spacer layer positioned above the fourth confinement layer;
   an etch stop layer positioned above the first spacer layer;
   a second spacer layer positioned above the etch stop layer;
   a grating layer positioned above the second spacer layer; and
   a top layer positioned above the grating layer.

2. The laser as recited in claim 1, wherein the substrate is a p-type substrate and the doping material is an n-type doping material.

3. The laser as recited in claim 1, wherein the substrate is an n-type substrate and the doping material is a p-type doping material.

4. The laser as recited in claim 1, wherein the doping material comprises beryllium.

5. The laser as recited in claim 1, wherein the doping material comprises carbon.

6. The laser as recited in claim 1, wherein the doping material comprises zinc.

7. The laser as recited in claim 6, wherein the quantum wells and the barrier layers are doped with a doping material with a concentration of about $5*10^{\wedge}16/cm^3$.

8. The laser as recited in claim 1, further wherein:
   the substrate, the mode modifier layer, the first confinement layer, and the second confinement layer are n-type layers;

the third confinement layer, the fourth confinement layer, the first spacer layer, the etch stop layer, the second spacer layer, and the grating layer are p-type layers; and the doping material is a p-type material.

9. The laser as recited in claim 1, further wherein:
the substrate, the mode modifier layer, the first confinement layer, and the second confinement layer are p-type layers; and
the third confinement layer, the fourth confinement layer, the first spacer layer, the etch stop layer, the second spacer layer, and the grating layer are n-type layers; and
the doping material is an n-type material.

10. A TOSA comprising:
a housing; and
the laser as recited in claim 1 positioned within the housing.

11. An optical transceiver module comprising:
the TOSA as recited in claim 10;
a ROSA; and
a PCB in electrical communication with the TOSA and the ROSA.

12. A DFB laser, comprising:
an n-type substrate;
an n-type mode modifier layer positioned above the n-type substrate;
a buffer layer positioned above the n-type mode modifier layer;
a first n-type confinement layer positioned above the buffer layer;
a second n-type confinement layer positioned above the n-type first confinement layer;
a doped active region positioned above the second n-type confinement layer, the doped active region comprising:
a plurality of quantum wells separated by a plurality of barrier layers, wherein the quantum wells and the barrier layers are doped with a p-type zinc material with a concentration between about $1*10^{16}/cm^3$ to about $5*10^{16}/cm^3$;
a first p-type confinement layer positioned above the doped active region;
a second p-type confinement layer positioned above the first p-type confinement layer;
a first p-type spacer layer positioned above the second p-type confinement layer;
a p-type etch stop layer positioned above the first p-type spacer layer;
a second p-type spacer layer positioned above the p-type etch stop layer;
a p-type grating layer positioned above the second p-type spacer layer; and
a top layer positioned above the p-type grating layer.

13. The DFB laser as recited in claim 12, wherein the doping material has a concentration of about $5*10^{16}/cm3$.

14. The DFB laser as recited in claim 12, wherein the DFB laser is configured to operate at 10 Gbit.

15. A TOSA comprising:
a housing; and
the DFB laser as recited in claim 12 positioned within the housing.

16. An optical transceiver module comprising:
the TOSA as recited in claim 15;
a ROSA; and
a PCB in electrical communication with the TOSA and the ROSA.

17. A DFB laser, comprising:
a substrate;
a mode modifier layer positioned above the substrate;
a buffer layer positioned above the mode modifier layer;
a doped active region positioned above the buffer layer, the doped active region comprising:
a plurality of quantum wells separated by a plurality of barrier layers, wherein the quantum wells and the barrier layers are doped with a doping material,
wherein an emission wavelength of the DFB laser is about 1310 nm or greater.

18. The DFB laser of claim 17, wherein the mode modifier is associated with a coupling of second-order transverse modes away from the active region of the DFB laser.

19. The DFB laser of claim 17, wherein a concentration of the doping material is between about $1*10^{16}/cm^3$ to about $1*10^{17}/cm^3$.

20. An optoelectronic transceiver having a TOSA that includes the DFB laser of claim 17.

* * * * *